United States Patent
Ito

(10) Patent No.: US 7,459,947 B2
(45) Date of Patent: *Dec. 2, 2008

(54) RADIO FREQUENCY DOUBLER

(75) Inventor: Junji Ito, Hirakata (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/819,232

(22) Filed: Jun. 26, 2007

(65) Prior Publication Data

US 2008/0054955 A1  Mar. 6, 2008

Related U.S. Application Data

(63) Continuation of application No. 11/058,225, filed on Feb. 16, 2005, now Pat. No. 7,245,164.

(30) Foreign Application Priority Data

Feb. 19, 2004  (JP)  ............................ 2004-042426

(51) Int. Cl.
*H03B 19/00* (2006.01)

(52) U.S. Cl. ...................... 327/116; 327/122

(58) Field of Classification Search ........................ None
See application file for complete search history.

(56) References Cited

U.S. PATENT DOCUMENTS

| | | | |
|---|---|---|---|
| 5,122,687 A | 6/1992 | Schmidt et al. ................ 326/52 |
| 5,151,625 A | 9/1992 | Zarabadi et al. ............. 327/103 |
| 5,166,552 A * | 11/1992 | Aipperspach et al. ....... 326/110 |
| 5,557,228 A | 9/1996 | Liu et al. ..................... 327/355 |
| 5,864,255 A | 1/1999 | Kwok et al. ................. 327/359 |
| 5,974,059 A * | 10/1999 | Dawson ......................... 372/6 |
| 6,257,688 B1 | 7/2001 | Kubo et al. ................... 347/11 |
| 6,329,864 B2 | 12/2001 | Suematsu et al. ........... 327/356 |
| 6,348,821 B1 * | 2/2002 | Schwartz .................... 327/122 |
| 6,348,830 B1 | 2/2002 | Rebeiz et al. ............... 327/355 |
| 6,864,728 B1 | 3/2005 | Lu et al. ..................... 327/122 |
| 7,245,164 B2 * | 7/2007 | Ito .............................. 327/116 |
| 2004/0257129 A1 | 12/2004 | Kwok et al. ................. 327/116 |

FOREIGN PATENT DOCUMENTS

JP  2998773  11/1999

* cited by examiner

*Primary Examiner*—Tuan T. Lam
*Assistant Examiner*—Hiep Nguyen
(74) *Attorney, Agent, or Firm*—Steptoe & Johnson LLP

(57) ABSTRACT

When a signal of a double frequency is generated from the original signal, conventionally a 90-degree phase-shift circuit is necessary to suppress an output of a DC component and efficiently obtain a double wave. According to the present invention, an equal RF signal is inputted to input terminals and an output is matched with a frequency as high as that of the original frequency in a Gillbert cell double-balanced mixer, so that a doubled output is obtained with no DC offset. According to the circuit configuration of the present invention, it is possible to provide a circuit readily performing integration and to efficiently output only a double frequency merely by inputting a simple differential signal without the need for the original signal which has been phase controlled. Further, a DC short circuit in the resonance circuit makes it possible to eliminate a DC offset voltage in an output.

5 Claims, 5 Drawing Sheets

F I G. 1
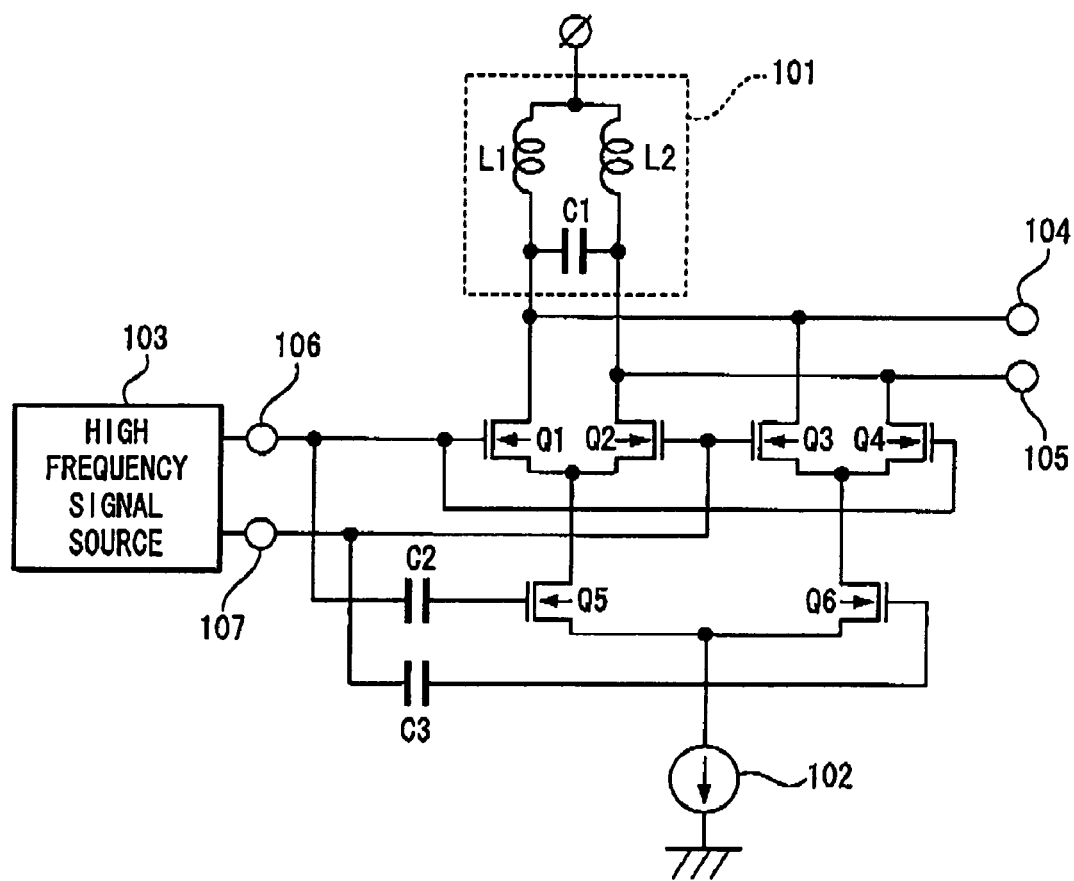

F I G. 2
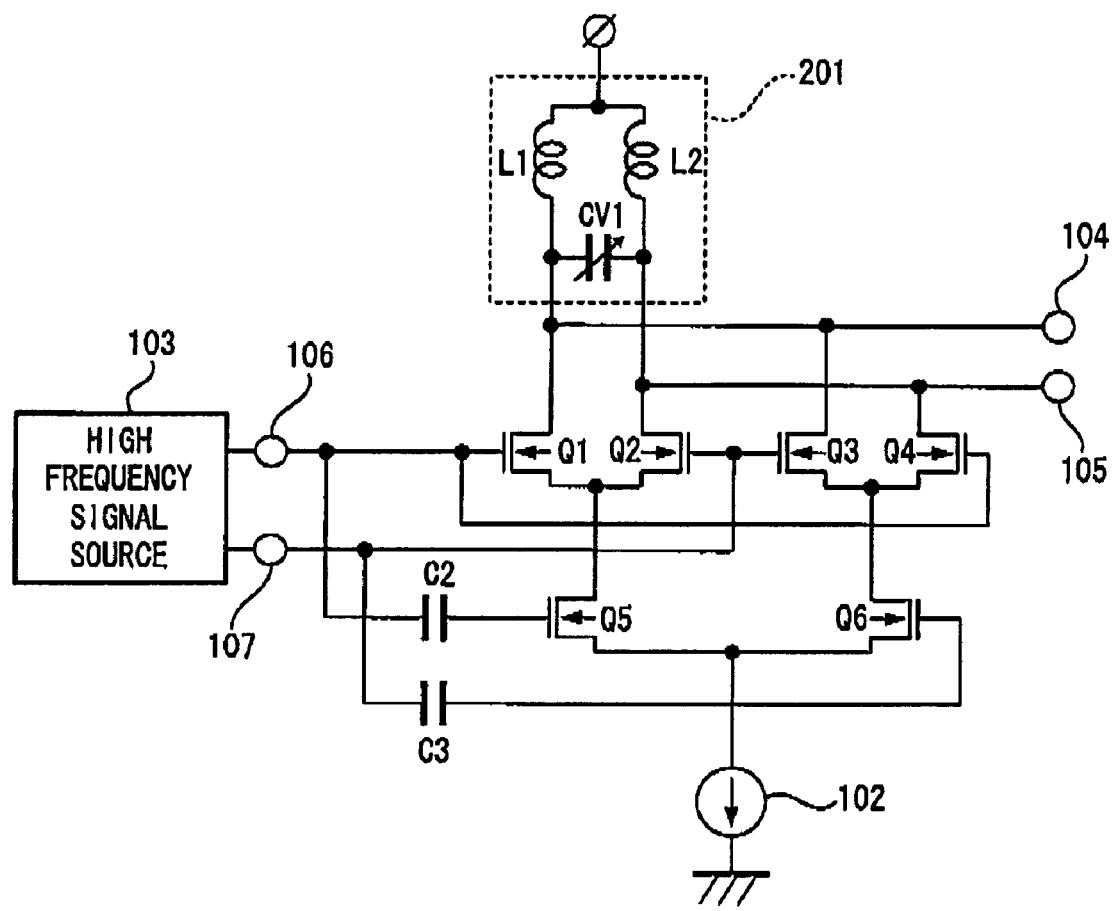

F I G. 5
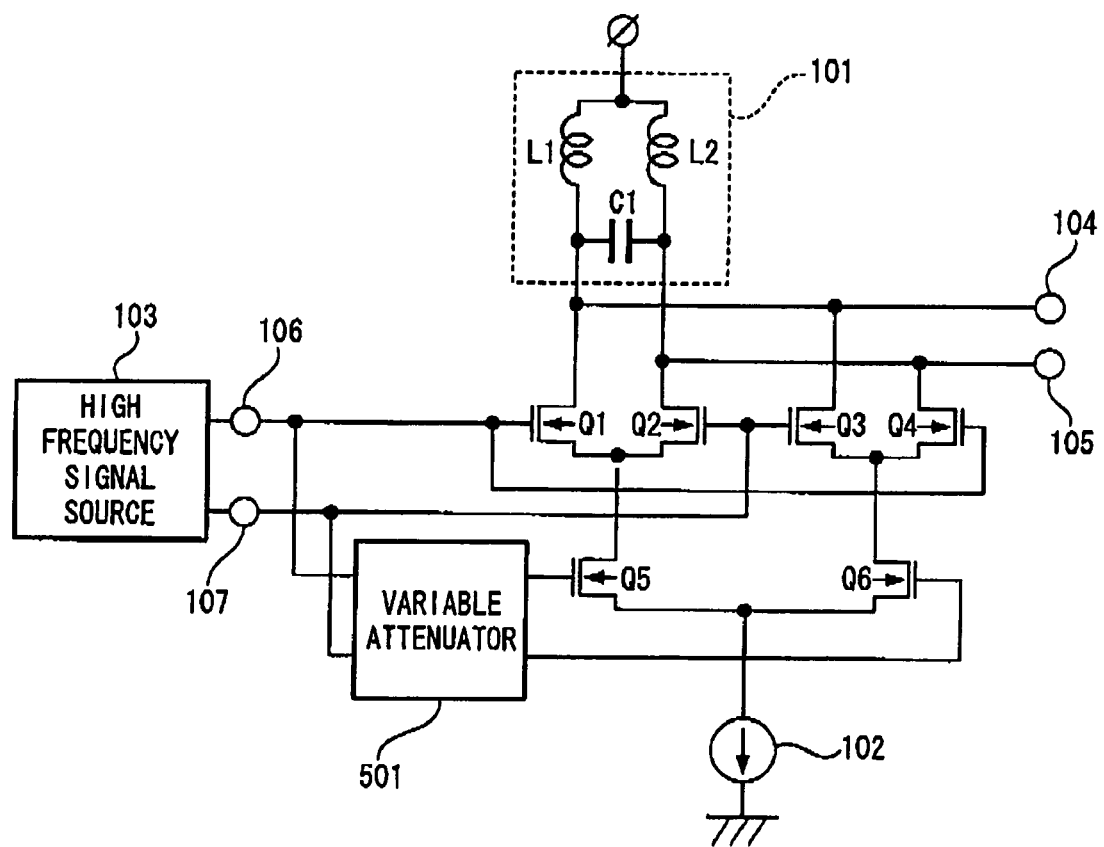

RADIO FREQUENCY DOUBLER

This application is a continuation of U.S. patent application Ser. No. 11/058,225, filed on Feb. 16, 2005, now U.S. Pat. No. 7,245,164 which is hereby incorporated by reference in its entirety.

FIELD OF THE INVENTION

The present invention relates to a high frequency doubler in which a differential signal of a high frequency is supplied to the base of a transistor and a tuned circuit resonating at a frequency twice as high as a frequency of the original signal is connected to a collector terminal.

BACKGROUND OF THE INVENTION

In recent years, as communications speed up, frequencies used for mobile phones and so on have increased to the 1 GHz, 2 GHz, and 5 GHz bands. Thus, a technique for generating an RF frequency is important. As a solution for attaining the technique, a technique of multiplying a low frequency of the original signal to a desired frequency is available.

Doublers frequently used as integrated circuits include an application of a Gillbert cell double-balanced mixer circuit, which uses a differential amplifier shown in FIG. 3. In this circuit, high frequency differential signals having been phase shifted from each other by 90 degrees are inputted to inputs RFin1 and RFin2, respectively, and a doubled signal is obtained via a resistance load. This operating principle will be briefly discussed below. The inputs having been phase shifted by 90 degrees can be represented as a sin wave and a cos wave. The frequency conversion of a double balanced mixer is expressed by formula 1 below.

$$y = \sin f * \cos f = \tfrac{1}{2} \sin 2f \qquad \text{Formula 1}$$

where f represents a frequency of an inputted signal. As a result, a frequency twice as high as a frequency of the original signal is generated from formula 1 as an output.

It is understood that a doubled signal can be obtained thus by the double balanced mixer. When a phase difference between input signals is deviated from 90 degrees, formula 1 is not established and a frequency obtained by adding a frequency of an input to an output, that is, a double frequency is generated and a DC component, which is a frequency difference between inputs, is also generated. This means that the output level of a signal with a double frequency is also changed, resulting in a problem in practical use. In actual circuits, a phase-shift circuit and a correction circuit for obtaining a preferred 90-degree phase shift are used to prevent such a deviation of a phase difference. However, the circuit size is increased by using such a circuit and current consumption also increases. Meanwhile, a simple technique for using a resonance circuit for an output is also proposed.

Referring to FIG. 4, the following will describe a method disclosed in JP2998773B where a transistor circuit and a resonance circuit are combined. In this circuit, a high frequency signal inputted to the base of a transistor Q is basically distorted by the transistor Q which is biased to increase non-linearity. The high frequency signal is selectively amplified by a double resonance circuit (L, C2) connected to a collector.

However, the circuit of JP2998773B shown in FIG. 4 is a single-phase circuit and thus is not applicable to an integrated circuit using a differential circuit. Moreover, in this circuit, the output of the original signal serving as an input signal is just suppressed by the frequency characteristic of the resonance circuit connected to the collector. Thus, the circuit is not applicable to a system requiring a high suppression level of the original signal. Meanwhile, in the doubler which is an application of the Gillbert cell double-balanced circuit using the differential amplifier of FIG. 3, the component of the inputted original signal is offset and is not outputted in theory. In reality, an ideal multiplication is not performed due to asymmetry caused by variations between transistors. The original signal is outputted but has an extremely small value as compared with the circuit configuration of FIG. 4. However, as described above, inputted signals are phase shifted by 90 degrees and thus the output levels of an outputted DC and a double wave are changed.

DISCLOSURE OF THE INVENTION

In view of the above problem, an object of the present invention is to efficiently extract a doubled signal with ease.

In order to attain the object, a method of manufacturing a semiconductor device of the present invention comprises the steps of: connecting the emitters of a first transistor and a second transistor and the collector of a fifth transistor, connecting the emitters of a third transistor and a fourth transistor and the collector of a sixth transistor, connecting the emitter of the fifth transistor and the emitter of the sixth transistor, connecting the bases of the first and fourth transistors and the base of the fifth transistor via a first capacitor, connecting the bases of the second and third transistors and the base of the sixth transistor via a second capacitor, connecting the collectors of the first transistor and the third transistor, connecting the collectors of the second transistor and the fourth transistor, connecting a tuned circuit to terminals connecting the collectors of the first and third transistors and the collectors of the second and fourth transistors, the tuned circuit resonating at a double frequency, and providing the base terminal of the first transistor and the base terminal of the second transistor with a signal source of a radio frequency band for a differential input.

In this circuit, a resonance circuit resonating at a double frequency has a DC short circuit between the collector terminals of the transistors.

Further, the resonance circuit has a variable capacitance for controlling a capacitance value of a capacitor constituting the resonance circuit, so that output power is made variable.

Moreover, the resonance circuit has a variable capacitance for discretely controlling a capacitance value of a capacitor constituting the resonance circuit, so that an outputted frequency is switched to a double frequency and a quadruple frequency.

A variable attenuator is inserted between the base inputs of the fifth and sixth transistors and the high frequency signal source to make an output signal level variable.

According to the circuit configuration of the present invention, it is possible to provide a circuit capable of readily performing integration and efficiently output only a double frequency merely by inputting a simple differential signal without the need for the original signal which has been phase controlled. Further, a DC short circuit in the resonance circuit makes it possible to eliminate a DC offset voltage in an output. A variable capacitance can be changed to vary a conversion gain relative to a desired double frequency. The output level of a doubled output can be changed by varying the level of the original signal inputted to the bases of the fifth and sixth transistors.

BRIEF DESCRIPTION OF THE DRAWINGS

FIG. 1 is a structural diagram showing electrical connection of a high frequency doubler;

FIG. 2 is a structural diagram showing electrical connection of a high frequency doubler enabling a variable gain;

FIG. 5 is a structural diagram showing electrical connection of a high frequency doubler having a gain controlling function performed by a variable attenuator.

DESCRIPTION OF THE EMBODIMENTS

Embodiment 1

Figure 3:
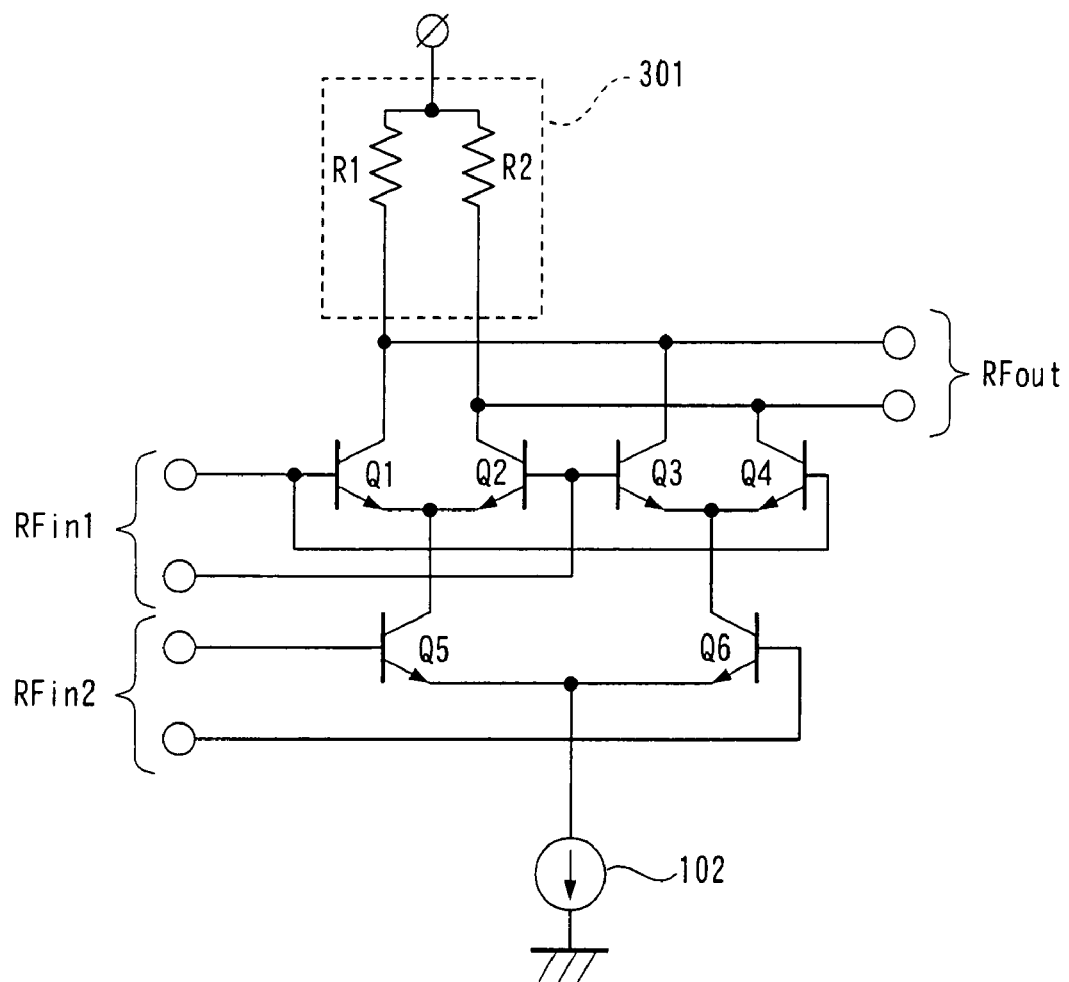
FIG. 3 is a schematic structural diagram showing a doubler using a conventional Gillbert cell double-balanced mixer.
Figure 4:
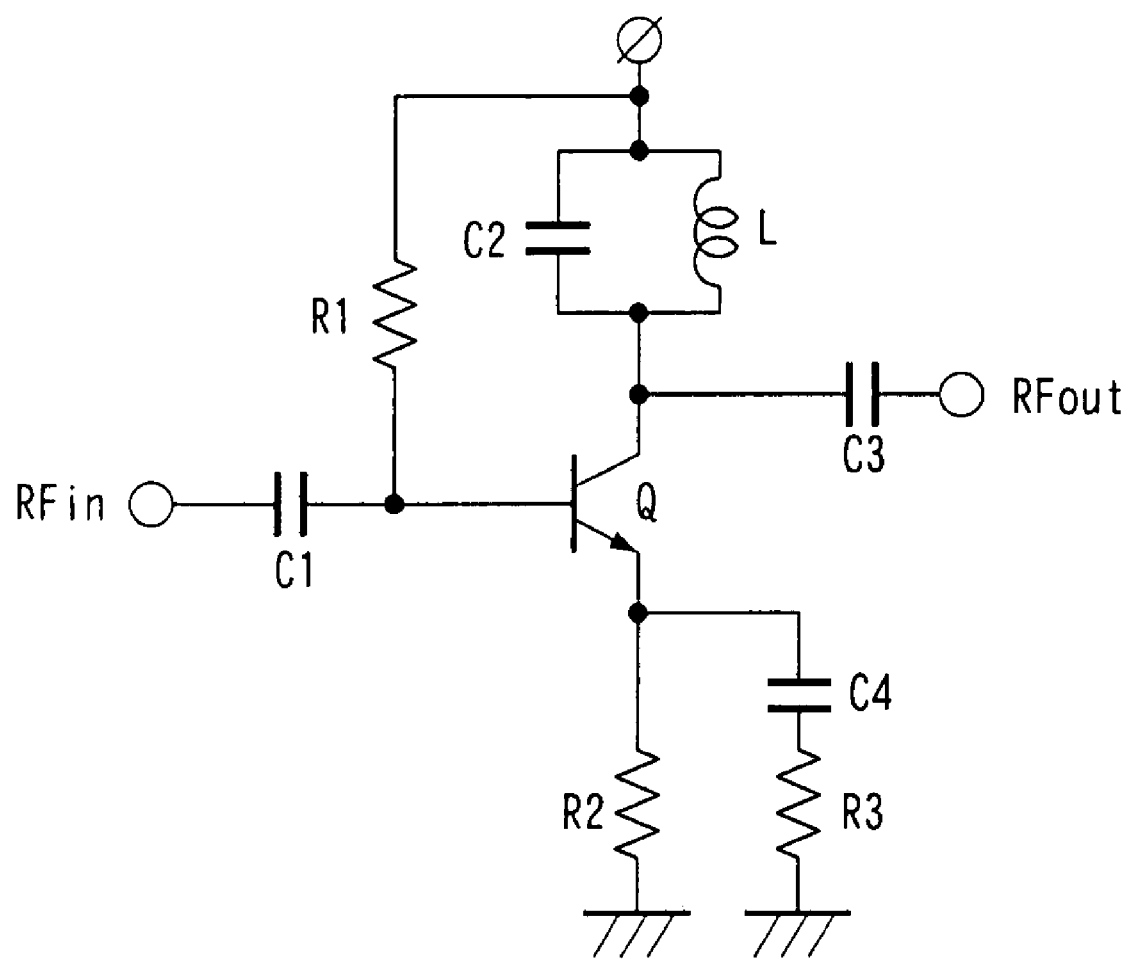
FIG. 4 is a structural diagram showing electrical connection of a high frequency doubler using a resonance circuit disclosed in JP2998773B.

The following will describe the circuit configuration of Embodiment 1 of the present invention in accordance with the accompanying drawings.

FIG. 1 is a circuit diagram showing electrical connection of an embodiment of a high frequency doubler according to the present invention. In FIG. 1, a high frequency signal source 103 indicates the original signal to be doubled and generates differential signals for output terminals 104 and 105. Signals from the signal source 103 are inputted to the bases of transistors Q1 and Q3 and the bases of transistors Q2 and Q4. At the same time, the signals are differentially inputted to transistors Q5 and Q6 via capacitors C2 and C3. At this moment, this circuit performs the same operation as a multiplier and a frequency doubled from that of the original signal is generated, as a differential output, at the collector terminals of the transistors Q1 and Q3 and the transistors Q2 and Q4. The original signal inputted then is not outputted according to the operation of the multiplier and only the signal having been multiplied by the input signal is outputted. In the present invention, although a double frequency and a DC component, which is a frequency difference, are outputted because of an equal input frequency, the double frequency component is selectively outputted due to the frequency characteristic of a resonance circuit 101 connected to the collectors. Since the same original signal is simply inputted via the capacitors, a DC offset can be readily suppressed unlike the conventional art in which input signals have to be phase shifted by 90 degrees. As indicated by the resonance circuit 101 of FIG. 1, inductors L1 and L2 constituting the resonance circuit have a DC short circuit (however, a DC resistance between the collector terminals of the first transistor and the second transistor is 0 to 10Ω or less) between the output terminals 104 and 105, so that a frequency change rate relative to DC can be almost 0 during frequency conversion. As a result, a DC offset is not generated, which is one of the two generated frequency components. Hence, voltages between the collectors and emitters of the transistors Q1, Q2, Q3, and Q4 do not depend upon input signals, so that operations can be performed with stably maintained symmetry.

Moreover, a gain relative to a doubled harmonic is determined by the frequency characteristic of the resonance circuit, so that the gain becomes irrelevant to the phase of an input signal. In this case, resonance means a frequency enabling matching of an impedance which is output-connected. Therefore, impedances connected to the output terminals 104 and 105 apparently change the values of a capacitance C1 and the inductors L1 and L2 of the resonance circuit 101.

Embodiment 2

FIG. 2 is a circuit diagram showing electrical connection of an embodiment of a high frequency doubler according to claims 3 and 4 of the present invention. Basic operations are similar to those of the above-described invention and thus the explanation thereof is omitted. In the present invention, capacitances are changed in inductors L1 and L2 and a variable capacitance CV1, which determine a resonant frequency in a resonance circuit, so that a conversion gain is changed relative to a frequency twice as high as a desired frequency. In this case, resonance means a frequency enabling matching of an impedance which is output-connected. Therefore, impedances connected to output terminals 104 and 105 apparently change the values of a capacitance and the inductors L1 and L2 of a resonance circuit 201. Further, in the doubler of the present invention, not only a doubled input signal but also signals obtained by multiplying an input signal by even numbers of 4, 6, and so on are generated on the outputs. In addition to this operation, the frequency of the resonance circuit is matched with quadruple and sextuple frequencies, so that quadruple and sextuple frequency components can be outputted efficiently.

Embodiment 3

FIG. 5 shows an embodiment of a variable gain high frequency doubler according to claim 5 of the present invention. Basic operations are similar to those of Embodiment 1 and thus the explanation thereof is omitted. In the present invention, the level of the original signal inputted to the bases of fifth and sixth transistors Q5 and Q6 is changed by a variable attenuator 501, so that the output level of a doubled output can be changed. The same effect as the variable attenuator can be obtained by a variable gain unit 501.

In the high frequency doubler according to first to fifth inventions, the transistors can be any kind of field-effect transistors (FET) such as a MOSFET.

As described above, the present invention is useful for outputting a double frequency.

What is claimed is:

1. A radio frequency doubler, comprising:
   sources of a first transistor and a second transistor and a drain of a fifth transistor being connected to each other, and sources of a third transistor and a fourth transistor and a drain of a sixth transistor being connected to each other;
   a source of the fifth transistor and a source of the sixth transistor being connected to each other;
   gates of the first and fourth transistors and a gate of the fifth transistor being connected to each other via a first capacitor, and gates of the second and third transistors and a gate of the sixth transistor being connected to each other via a second capacitor;
   drains of the first transistor and the third transistor being connected to each other, drains of the second transistor and the fourth transistor being connected to each other, and a tuned circuit being connected to terminals connecting the drains of the first and third transistors and the drains of the second and fourth transistors, the tuned circuit resonating at a double frequency; and
   a gate terminal of the first transistor and a gate terminal of the second transistor being provided with a signal source of a radio frequency band for a differential input.

2. The radio frequency doubler according to claim 1, wherein a resonance circuit resonating at a double frequency in the circuit of claim 1 has a DC resistance of 0 to 10 Ω. or less between a drain terminal of the first transistor and a drain terminal of a second transistor.

3. The radio frequency doubler according to claim 1, wherein a resonance circuit in the circuit of claim 1 has a variable capacitance for controlling a capacitance value of a capacitor constituting the resonance circuit, so that output power is made variable.

4. The radio frequency doubler according to claim 1, wherein a resonance circuit in the circuit of claim 1 has a variable capacitance for discretely controlling a capacitance value of a capacitor constituting the resonance circuit, so that an outputted frequency is switched to a double frequency and a quadruple frequency.

5. The radio frequency doubler according to claim 1, further comprising a variable attenuator inserted between gate inputs of the fifth and sixth transistors and a radio frequency signal source to make an output signal level variable.

* * * * *